US007246333B2

(12) United States Patent
Bingham

(10) Patent No.: US 7,246,333 B2
(45) Date of Patent: Jul. 17, 2007

(54) APPARATUS AND METHOD FOR UNIFIED DEBUG FOR SIMULATION

(75) Inventor: Dustin Bingham, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/248,709

(22) Filed: Oct. 11, 2005

(65) Prior Publication Data

US 2007/0094562 A1    Apr. 26, 2007

(51) Int. Cl.
G06F 17/50    (2006.01)
(52) U.S. Cl. .................... 716/4; 716/1; 716/18; 703/14
(58) Field of Classification Search ............... 716/1, 716/4, 18; 703/14
See application file for complete search history.

(56) References Cited

U.S. PATENT DOCUMENTS

2003/0040896 A1 *    2/2003    McWilliams et al. ......... 703/13

OTHER PUBLICATIONS

Introduction to Specman by D. K. Tala, [webpage] [online]. Retrieved on Apr. 6, 2005, Retrieved from the internet: http://www.asic-world.com/specman/intro.html. Total p. 1.
Verilog Tools, [webpages] [online]. Retrieved on Apr. 6, 2005. Retrieved from the internet: http://www.asic-world.com/systemverilog/tools.html. Total pp. 4.
Verification Tools, [webpages] [online]. Retrieved on Apr. 6, 2005. Retrieved from the internet: http://www.asic-world.com/specman/tools.html. Total pp. 3.

"Coverage Analysis Techniques for HDL Design Validation" by J. Y. Yu, et al., Dept. of Electronics Engineering, National Chiao Tung University, Taiwan, R.O.C. Total pp. 8.
"A Novel Approach for Functional Coverage Measurement in HDL" by C.J. Liu, et al., Dept. of Electronics Engineering, National Chiao Tung University, HsinChu, Taiwan, R.O.C. Total pp. 4.
"A Survey: System-on-a-Chip Design and Verification" by A. Habibl, et al., Electrical & Computer Engineering Dept., Concordia University, Montreal, Quebec, Canada. Total pp. 32.
"Functional Verification at the PCB/System Level" by M. Munsey, Feb. 1, 2003, Printed Circuit Design Magazine. Total pp. 4.
Comparing TestWizard and Specman for Transaction-level Verification by C. Browry, [webpages][online]. Retrieved on Apr. 6, 2005. Retrieved from the internet: http:/www.avery-design.com/twwp.html. Total pp. 29.
Introduction to Verilog,[webpages][online]. Retrieved on Apr. 6, 2005. Retrieved from the internet: http:/66.102.7.104/search?q=cache:kU4Y-4Jp7pcJ:www.doe.carleton.ca/~shams/97350/Petervr1K.pdf.

* cited by examiner

Primary Examiner—Thuan Do
(74) Attorney, Agent, or Firm—Ricahrd P. Lange

(57) ABSTRACT

In one embodiment of the invention, a method for unified debug for simulation, includes: generating a transaction from a hardware verification language (HVL) testbench; copying signal states in the HVL testbench after the transaction is generated, wherein the signal states are copied in a hardware description language (HDL) mirror; generating a response to the transaction from a device-under-test (DUT); and displaying the signal states in the HVL testbench on a display screen as a first waveform, and displaying the DUT response on the display screen as a second waveform. In another embodiment of the invention, an apparatus is provided for unified debug for simulation, where the apparatus can perform the above method.

18 Claims, 3 Drawing Sheets

APPARATUS AND METHOD FOR UNIFIED DEBUG FOR SIMULATION

TECHNICAL FIELD

Embodiments of the invention relate generally to testing (simulation) methods in a test environment, and more particularly to an apparatus and method for unified debug for simulation.

BACKGROUND

The testing of the designs of electronics devices such as, for example, network switches or other devices, is performed in order to verify the functionalities of the designs and to detect for possible defects. Functional verification of a design permits the testing of circuit behavior before implementation of the design. As known to those skilled in the art, test cases are used for testing of the design. A test case is implemented by software code and provides one or more sets of stimulus that is driven into a design-under-test (DUT) so that the design-under-test is tested for correct functionalities and possible defects.

In order to detect a bug during simulation and perform functional verification of a circuit design, vectors (i.e., test patterns) are applied to stimulate incorrect behavior by the DUT. Vectors are also applied to propagate and detect the incorrect behavior in the DUT. The user then traces back through the output waveforms from the DUT in order to attempt to locate the source that is causing the incorrect behavior.

If the HVL (Hardware Verification Language) testbench is not performing an intended function, then problems in debugging would occur. For example, if the signaling from the HVL testbench is wrong (e.g., due to timing errors), then problems in debugging would occur. For example, if two transactors (in an HVL testbench) are being used in the simulation and the signaling between the transactors is not correct, then problems in debugging may occur, and current systems make it difficult for the user to determine the cause of the error because the user can only observe the active threads and the DUT output. If the HVL testbench is implemented by the SPECMAN product or other HVL testbench products, the user will be unable to detect the erroneous signaling from the HVL testbench because the user is only able to view a list of all active threads via a browser, and the user is viewing the active threads only as text information. The user will have great difficulty in determining the erroneous signaling by observing the active threads after the treads executed one or more clock cycles. Therefore, previous approaches are unable to provide a view of testbench state at the post-simulation time period. Previous approaches are also unable to evaluate the effects of changes to the testbench other than by performing manually-controlled measurements during runtime. Previous approaches are also unable to compare testbench behavior and testbench state between two different simulation runs with two different sets of simulation settings.

Therefore, the current technology is limited in its capabilities and suffers from at least the above constraints and deficiencies.

SUMMARY OF EMBODIMENTS OF THE INVENTION

In one embodiment of the invention, a method for unified debug for simulation, includes: generating a transaction from a hardware verification language (HVL) testbench; copying signal states in the HVL testbench after the transaction is generated, wherein the signal states are copied in a hardware description language (HDL) mirror; generating a response to the transaction from a device-under-test (DUT); and displaying the signal states in the HVL testbench on a display screen as a first waveform, and displaying the DUT response on the display screen as a second waveform.

In another embodiment of the invention, an apparatus for unified debug for simulation, includes: a hardware verification language (HVL) testbench configured to generate a transaction; a hardware description language (HDL) mirror configured to copy signal states in the HVL testbench after the transaction is generated; an HDL simulator configured to generate a simulation based upon the transaction; a device-under-test (DUT) configured to generate a response to the transaction; and a display screen configured to display the signal states in the HVL testbench as a first waveform, and display the DUT response as a second waveform.

These and other features of an embodiment of the present invention will be readily apparent to persons of ordinary skill in the art upon reading the entirety of this disclosure, which includes the accompanying drawings and claims.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF PREFERRED EMBODIMENTS

In the description herein, numerous specific details are provided, such as examples of components and/or methods, to provide a thorough understanding of embodiments of the invention. One skilled in the relevant art will recognize, however, that an embodiment of the invention can be practiced without one or more of the specific details, or with other apparatus, systems, methods, components, materials, parts, and/or the like. In other instances, well-known structures, materials, or operations are not shown or described in detail to avoid obscuring aspects of embodiments of the invention.

Previous methods do not record the state of the HVL (hardware verification language) testbench objects over time, where the objects are viewable after the simulation is completed. Previous approaches would require breakpointing during the running of the simulation so that the objects can be viewed, and the running of the simulation is then continued after object viewing. In contrast, an embodiment of the invention advantageously allows the debugging of complex transaction interactions and the debugging of HVL model inconsistencies, as discussed in detail below.

An embodiment of the invention also allows a verifier (tester) to prove (verify) what a user may suspect to be occurring in the testbench (e.g., the user may suspect timing errors by the transactors in the testbench or other errors in the testbench). Specifically, an embodiment of the invention provides the display of waveforms of the testbench activity and waveforms from the HDL (Hardware Description Language) simulator, so that improper behavior by the testbench can be detected if problems occur during debugging. In contrast, the previous methods only permit the designer to argue (or speculate) about what may have occurred in the testbench and, typically, the designer may have difficulty in proving what had occurred in the testbench.

An embodiment of the invention may also allow the compression of behavior of the testbench between two different simulation runs. In other words, the user can compare and contrast the waveforms between two different simulation runs, in order to detect improper behavior of the testbench signals.

Figure 1:
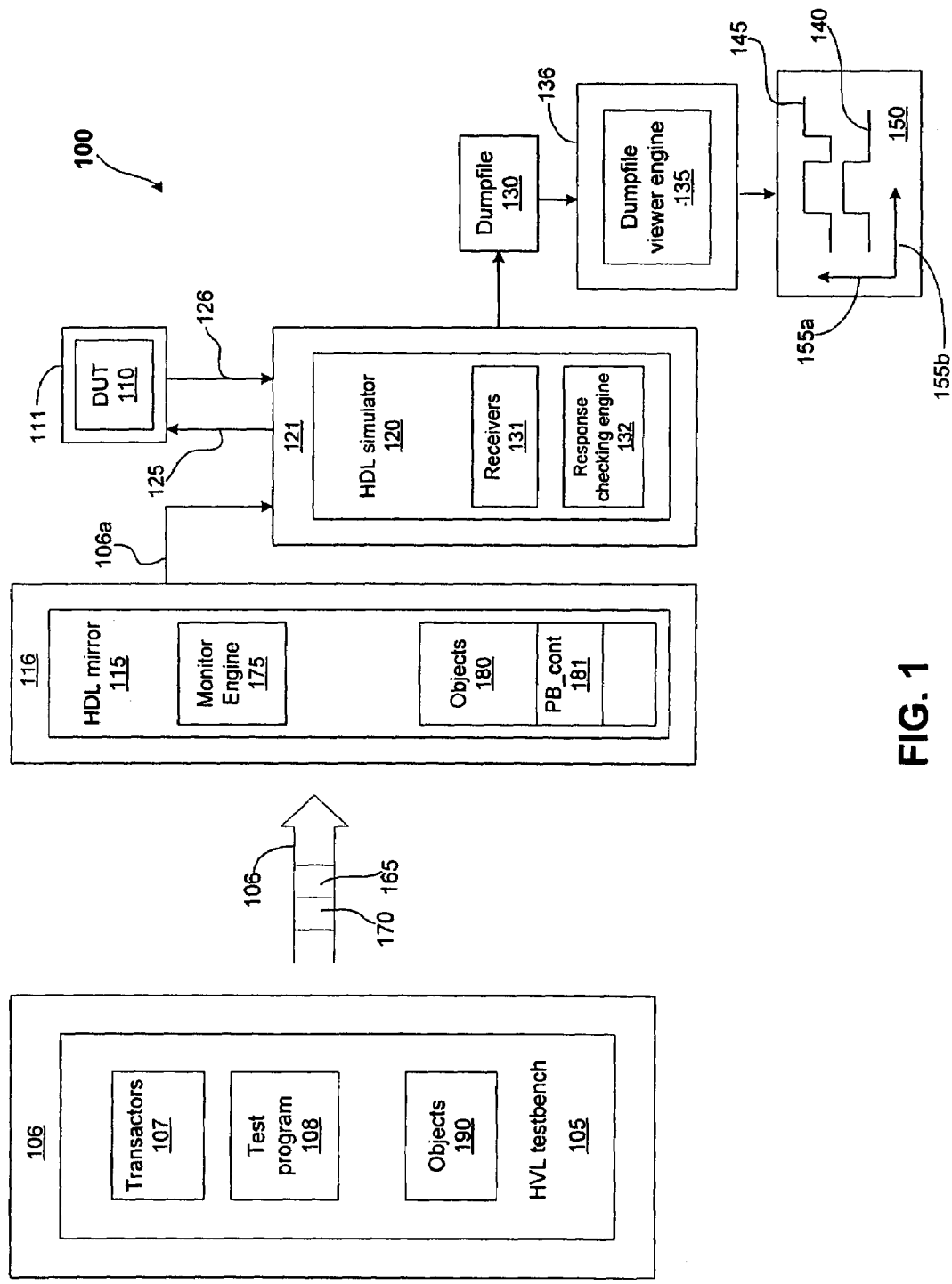
FIG. 1 is a block diagram of a system (apparatus) for unified debug for simulation, in accordance with an embodiment of the invention.

FIG. 1 is a block diagram of a system (apparatus) 100 for unified debug for simulation, in accordance with an embodiment of the invention. The HVL (Hardware Verification Language) testbench 105 is used to test a device-under-test (DUT) 110. An HDL (Hardware Description Language) simulator 120 is used for simulation of the DUT 110. Typically, the HVL testbench 105 is in a computing device (e.g., server) 106. It is understood by those skilled in the art that the computing devices shown in FIG. 1 include standard components that are not shown such as, for example, processors, operating systems, memories, and other hardware and other software/firmware that permit the computing devices to perform standard computing operations. Typically, the HDL simulator 120 is also in a computing device (e.g., server) 121. Typically, the DUT 110 executes in a computing device (e.g., server) 111. However, it is within the scope of the embodiments of the invention that various components in FIG. 1 may be implemented in the same computing device. For example, at least some of the HVL testbench 105, HDL mirror 115, HDL simulator 120, DUT 110, and dumpfile viewer engine 135 may be implemented in the same computing device. Therefore, the number of computing devices that implement the system 100 may vary.

As known to those skilled in the art, in order to simulate and verify the design responses to different stimuli, testbenches are created by typically using either HDL or HVL. A testbench invokes the design-under-test, generates the simulation input vectors (e.g., test patterns), and implements the system tasks to view the results of the simulation.

As known to those skilled in the art, in a transaction-based verification method, three main elements are used: transactions 106, a transactor 107, and a test program 108. A transaction 106 is typically a transfer of data or control between a transactor 106 and the design to be tested. Examples of a transaction 106 can be a memory read to a complex transfer of an entire data packet across a communications interface. The test program 108 is used for application specific testing. The transactor 107 acts as the abstraction layer between the test program 108 and the DUT. The transactor 107 maps the transaction level request made by the test program 108 to the detailed signal-level protocol on the interfaces of the DUT. Each transactor 107 includes a plurality of tasks that execute specific transactions 106. The test program 108 coordinates the transactions 106 by sending calls to each transactor 107 in order to invoke each transactor 107. The transactions 106 invoke a response from the DUT 110 so that proper functionalities and possible defects are detected in the DUT 110.

In an embodiment of the invention, the transactions 106 from the HVL testbench 105 is received by an HDL mirror 115. Typically, the HDL mirror 115 is in a computing device (e.g., server) 116. The transactions 106 will be a list of signals that have various signal states and are the signal states from the HVL testbench 105. Therefore, the HDL mirror 115 mirrors (copies) the signal states of the transactions 106 from the HVL testbench 105, by sampling the signal states within predetermined sampling intervals. As discussed below, a dumpfile viewer engine 135 permits the tester to view the signal states of the transactions 106 over time, so that errors (e.g., timing errors) in the HVL testbench 105 are observable to the user.

The HDL simulator 120 interacts with the DUT 110. The HDL simulator 120 receives the transactions 106a from the HDL mirror 115 and then runs the simulation by driving simulation inputs 125 into the DUT 110 and receives responses 126 from the DUT 110 in response to the simulation inputs 125. The simulation inputs 125 are determined by the transactions 106a.

The HDL simulator 120 generates a dump file 130 for waveform viewers, based upon the simulation.

Typically, the HDL simulator 120 includes receivers 131 that receive and process the transactions 106a from the HDL mirror 115, and provides the simulation inputs 125 that are driven into the DUT 110. Typically, the HDL simulator 120 also includes a response checking engine 132 that processes the responses 126 from the DUT 110 during the simulation and generates the dumpfile 130.

The dumpfile 130 records every value change of selected variables (signal states) during the simulation so that the user can recover the execution status from the dumpfile 130.

In an embodiment of the invention, the output (transactions) 106a of the HDL mirror 115 and the output 126 from the DUT 110 are received and processed by the HDL simulator 120 which then generates a dumpfile 130.

The dumpfile 130 can be viewed by use of a dumpfile viewer engine 135 in a computing device (e.g., server) 136, so that the user can view the HDL mirror output(s) 106a in a waveform(s) 140 and the DUT output(s) 126 in a waveform(s) 145. The dumpfile viewer engine 135 permits the viewing of the transactions 106a,and permits identification of mismatches between a transaction 106a and the responses 126 of the DUT 110 from the simulation inputs 126 due to errors (e.g., timing errors in the transactors 107 in the HVL testbench 105).

The output waveforms 140 and 145 can be viewed in, for example, a display screen 150 of the computing device 136. Note that more than one waveform can be shown in the display screen 150, depending on the number of signals in the transactions 106a and DUT responses 126. The waveforms 140 and 145 can be shown in, for example, on the display screen 150 in a signal state value axis versus time axis, where the signal state value is indicated in the Y-axis 155a and the time period is shown in the X-axis 155b. Therefore, the dumpfile viewer engine 135 permits the showing of a picture of the waveforms of the various signals (including the signal highs, signal lows, and other portions of the waveforms) that are used during the simulation.

As known to those skilled in the art, HVL is a language that is used to write testbenches and verification environments, and to control simulations. The HVL testbench 105 may be implemented by, for example, the SPECMAN ELITE HVL compiler which is commercially available CADENCE DESIGN SYSTEM, INC., San Jose, Calif.

As known to those skilled in the art, HDL is a language that is used to describe the functions of an electronic circuit for documentation, simulation, or/and logic synthesis. Although many proprietary HDLs have been developed, Verilog and VHDL are the major standards used for simulation and logic synthesis. The HDL simulator 120 may be implemented by, for example, the NC VERILOG simulator which is commercially available from CADENCE DESIGN SYSTEM, INC. or the VCS simulator which is commercially available from SYNOPSYS, INC., Mountain View, Calif.

As known to those skilled in the art, a dumpfile will display file contents in hex dump which is a listing of memory contents in hexadecimal.

As known to those skilled in the art, a dumpfile viewer provides a graphical environment for HDL simulators and offers a suite of advanced debugging and analysis tools and high-level design and visualization capabilities. The dumpfile viewer engine 135 may be implemented by, for example, the SIMVISION product which is commercially available from CADENCE DESIGN SYSTEM, INC.

In an embodiment of the invention, the HDL mirror 115 chronicles the signal states that occur from the testbench. The HDL mirror 115 has a list of signals that have various states from the HVL testbench 105. The HDL mirror 115 is preferably updated at a predetermined interval by a monitor engine 175 that samples the signal states (in transactions 106) in the HVL testbench 105 at a predetermined interval. Therefore, the HDL mirror 115 will permit the user to determine (via dumpfile viewer engine 135) if, for example, there are timing errors in the signaling between the transactors 107 in the HVL testbench 105. The HDL mirror 115 may be implemented in VERILOG HDL.

The DUT 110 receives the requests 125 as inputs and generates ACKs (acknowledgements) 126 as outputs. If the DUT 110 receives a request 125 (with a target address), and then a write transaction, then data is written into the DUT 110. If the DUT 110 receives a request 125 (with a target address) and then a read transaction, then the DUT 110 outputs an ACK 126 and the requested data which is read from the target address in the DUT 110.

The transactor 107 is source code that permits the generations of a request 125 (via HDL simulator 120) with a target address, and will receive an ACK 126 back from the DUT 110 (via HDL simulator 120) after a given number of clock cycles (e.g., 4 clock cycles). This received ACK 126 includes a control field (e.g., bits 0 to 5) that indicates the location to next be read by the transactor 107.

In a transaction 106, the following fields are included: request, address, data, control bit, and state.

Assume, for example, that the control bit is 2 bits. Assume further in this example that a control bit 165 (in a transaction 106) has various values that corresponds to various states which are described as follows. A control bit with value 00 corresponds to an initial read by a transactor 107. A control bit with value 01 corresponds to a read by a transactor 107 for an IPv4 packet. A control bit with value 10 corresponds to a read by a transactor 107 for an IPv6 packet. A control bit with value 11 corresponds to a state where the transactor 107 is waiting to receive for an ACK 126. Continuing with this present example, for the initial read transaction, the control bit is set to a value 00 to indicate an initial read by the transactor 107, and the transactor 107 will then transmit a request 106. The HDL simulator 120 will transmit the request 106 as simulation signal 125 to the DUT 110. After the transactor 107 transmits the request 106, the control bit is set to 11 to indicate that the transactor 107 is waiting to receive an ACK 126 in response to the previously transmitted request 106. Assume that an ACK 126 should be received by the transactor 107 (via HDL simulator 120) within, for example, 4 clock cycles, after the transactor 107 sends the previously transmitted request 106. If the ACK 126 is not received by the transactor 107 within 4 clock cycles, then there is a failure condition that must be evaluated by the tester.

Note that when the HDL mirror 115 receives a transaction 106, the transaction 106 will also include a "nexttran" bit 170 which indicates the next state of the transactor 106. Therefore, since the user can determine from the HDL mirror 115 about the next state that the transactor 107 will transition, the user will be able to advantageously detect any incorrect or improper behavior by the transactor 107. The user can view the value of the nexttran bit 170 via the monitor 150 by use of the dumpfile viewer engine 135.

As mentioned above, the monitor engine (Specman monitor) 175 is included in the HDL mirror 115, where the monitor engine 175 will sample the transactions 106 from the HVL testbench 115. For example, the monitor engine 175 will sample the transactions 106 (including the control bit values 165) at a predetermined sampling interval (e.g., sampling is performed every 1 clock cycle, although other sampling interval values can be used). The sampled values in the transactions 106 are stored in objects 180 in the HDL mirror 115. For example, the control values 165 that are sampled by the monitored engine 175 are stored in a "PB_control" object 181 in the objects 180.

The creation of HDL objects 180 matches or mirrors the state information (values) of the HVL objects 190 which are the states of the transactions 106. In other words, particular signal states will change in value in the HVL objects 190 after a transaction 106 is generated by a transactor 107. The contents of the HVL objects 190 are mirrored to the HDL mirror objects 180 on a fixed sampling interval. An HDL mirror object 180 may be a register object, integer object, or ASCII object in the HDL mirror 115. If a particular HVL object 190 represents a state machine state in the HVL testbench 105, then an HDL mirror object 180 that will mirror the particular HVL object 190 will preferably be an ASCII object, since the ASCII object can be easily read by the dumpfile viewer engine 135. Therefore, the dumpfile viewer engine 135 reads the values of the objects 180 in the HDL mirror 115 and can display the selected values of the objects 180 via the monitor 150 in waveforms. For example, dumpfile viewer engine 135 permits the values in the objects 180 to be viewed in waveforms 140, so that the user can view the object values with respect to time.

Note that there may be four-hundred (400) or more signals in the transactions 106 that may be sampled by the monitor engine 175 and may be selectively displayed by the dumpfile viewer engine 135 as waveforms in the monitor 150. However, the number of signals may vary in number.

The dumpfile viewer 135 permits the transactions 106 from the HVL testbench 105 to be viewed in waveform and the DUT response 126 to also be viewed in waveform. The waveforms that represent the transactions 106 and DUT responses 126 may be displayed as side-by-side in the display screen 150.

Therefore, an embodiment of the invention permits the viewing of the behavior of the HVL testbench 105 during simulation runtime on the DUT testing and the viewing of the behavior of the HVL testbench 105 prior to simulation runtime on the DUT testing, for purposes of debugging. For example, an embodiment of the invention allows the tracking of where a change in parameters has occurred in the HVL testbench 105 or the DUT 110. If a parameter change(s) was made in the DUT 110 and no parameter changes were made in the HVL testbench 105, then the dumpfile viewer engine 135 will show the same waveform values of the signals from the HVL testbench 105 prior to runtime and after runtime. If the waveforms of the signals from the HVL testbench 105 are showing the same output at the same timing, then a verification is shown to the user that a change was not made in the HVL testbench parameters and that a parameter change may have occurred instead in the DUT, for purposes of debugging. Alternatively, if a parameter change(s) had occurred in the HVL testbench 105 because the timing of transactors signals had changed or a response signal had occurred due to a particular input signal, then the user can use the waveforms displayed by the dumpfile viewer engine 135 to determine any particular parameter change for purposes of debugging.

Figure 2A:
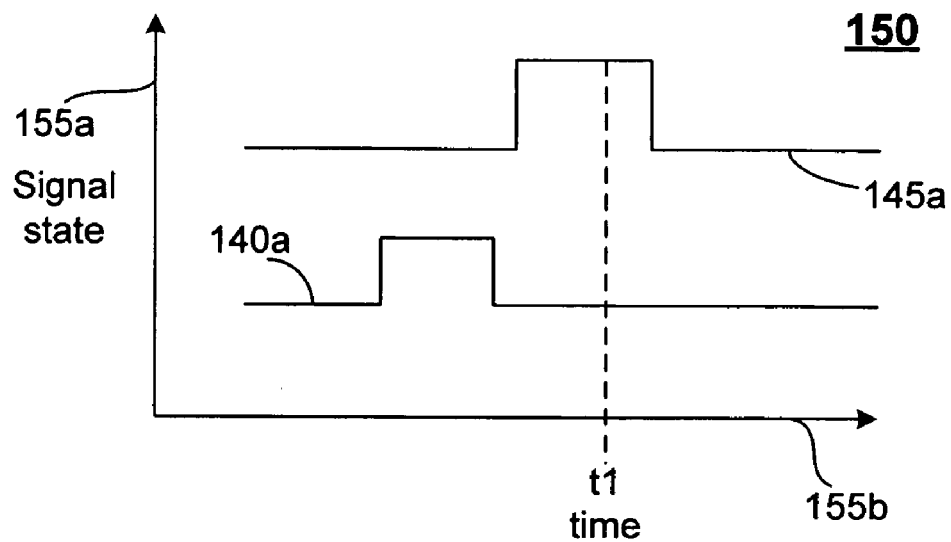
FIGS. 2A is a block diagram of example waveforms that are displayed, in accordance with an embodiment of the invention.
Figure 2B:
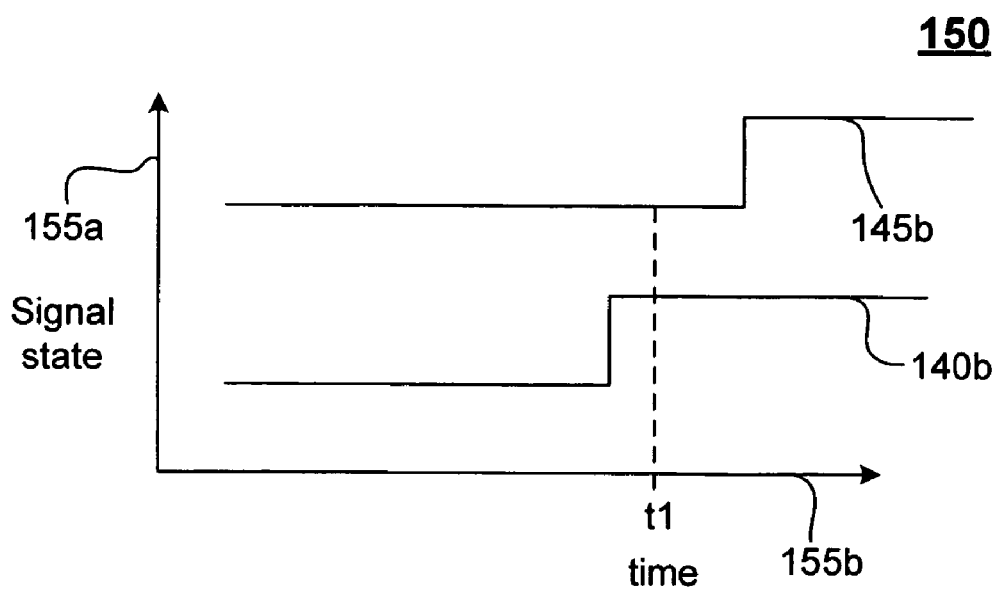
FIGS. 2B is a block diagram of other example waveforms that are displayed, in accordance with an embodiment of the invention.

FIGS. 2A and 2B are block diagrams of example waveforms that are displayed, in accordance with an embodiment of the invention. An embodiment of the invention is also useful in the following testing scenario. Assume that there are two (2) or more tests that are supposed to produce identical output waveforms. However, assume further that the dumpfile viewer engine 135 is causing the display screen 150 to show output waveforms that are different. Therefore, the user can analyze the displayed waveforms and observe where the different sets of output waveforms are diverging, for purposes of debugging. For example, in FIG. 2A, with a particular HVL testbench signal waveform 140a, a DUT output waveform 145a should have a high signal state at time t1 as shown in the drawing. For another particular HVL testbench signal waveform 140b as shown in FIG. 2B, the DUT output waveform 145b should be identical to the DUT output waveform 145a in FIG. 2A, as required by the design parameters of the DUT 110. However, FIG. 2B shows the DUT output waveform 145b as being in a low signal state at time t1, while DUT output waveform 145a is in a high signal state at time t1. Therefore, based on the waveforms sets shown in the display screen 150, the user can observe that the DUT output waveforms 145a and 145b diverge from time t1 and proceed to debug any problems in the HVL testbench 105. Embodiments of the invention are also useful in other testing scenarios.

Figure 3:
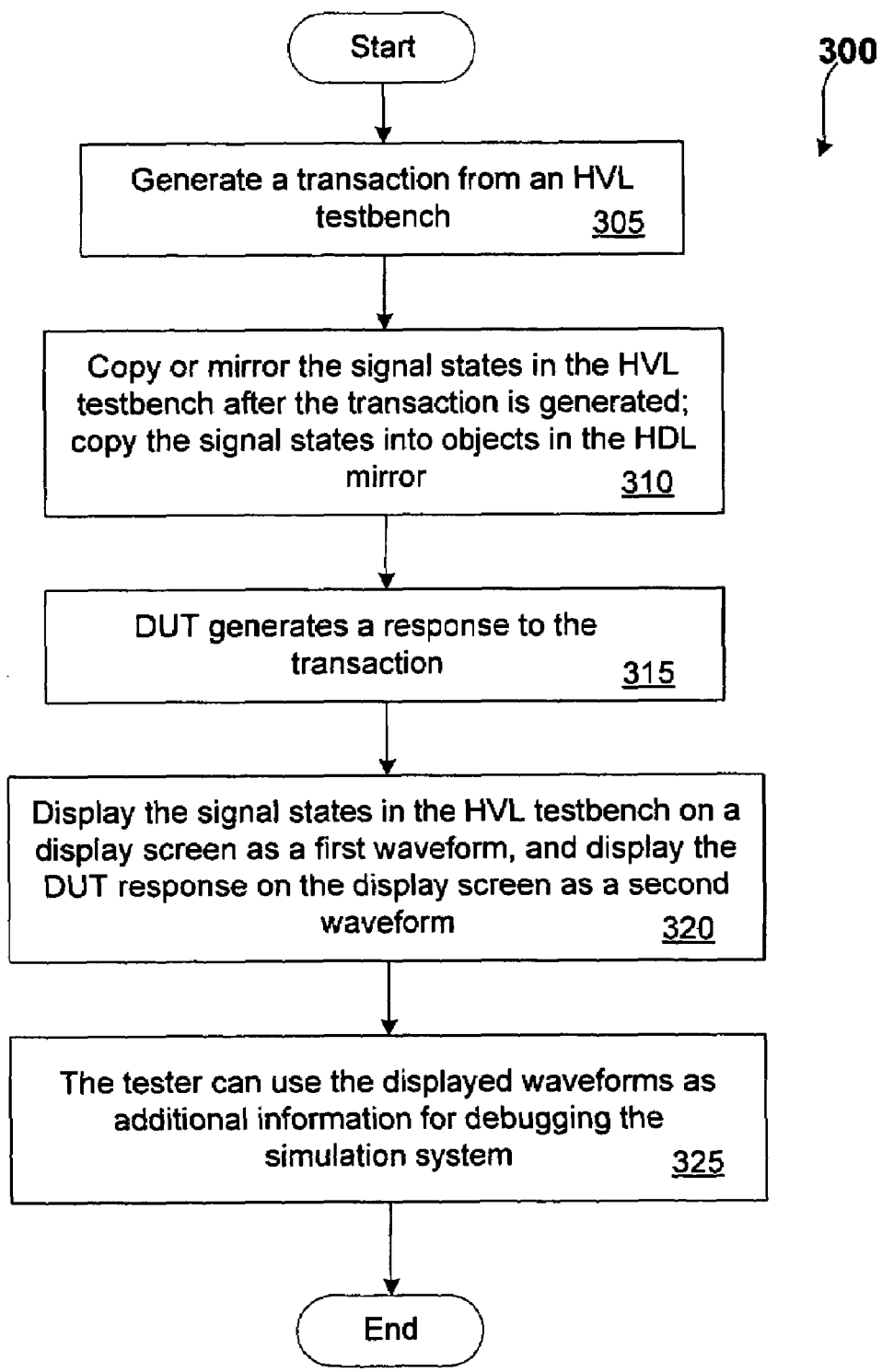
FIG. 3 is a flowchart of a method for unified debug for simulation, in accordance with an embodiment of the invention.

FIG. 3 is a flowchart of a method 300 for unified debug for simulation, in accordance with an embodiment of the invention. In block 305, a transaction is generated from an HVL testbench. In block 310, the signal states in the HDL testbench is copied or mirrored after the transaction is generated. The signal states are copied or mirrored in objects in the HDL mirror. In block 315, the DUT generates a response to the transaction. Note that alternatively, the steps in blocks 310 and 315 can occur simultaneously or the steps in block 315 can alternatively occur before the steps in block 310. In block 320, the signal states in the HVL testbench are displayed on a display screen as a first waveform, and the DUT response is displayed on the display screen as a second waveform. In block 325, the tester can use the displayed waveforms as additional information for debugging the simulation system 100.

Various elements in the drawings may be implemented in hardware, software, firmware, or a combination thereof.

The various engines or software discussed herein may be, for example, computer software, firmware, commands, data files, programs, code, instructions, or the like, and may also include suitable mechanisms.

Reference throughout this specification to "one embodiment", "an embodiment", or "a specific embodiment" means that a particular feature, structure, or characteristic described in connection with the embodiment is included in at least one embodiment of the invention. Thus, the appearances of the phrases "in one embodiment", "in an embodiment", or "in a specific embodiment" in various places throughout this specification are not necessarily all referring to the same embodiment. Furthermore, the particular features, structures, or characteristics may be combined in any suitable manner in one or more embodiments.

Other variations and modifications of the above-described embodiments and methods are possible in light of the foregoing disclosure. Further, at least some of the components of an embodiment of the invention may be implemented by using a programmed general purpose digital computer, by using application specific integrated circuits, programmable logic devices, or field programmable gate arrays, or by using a network of interconnected components and circuits. Connections may be wired, wireless, and the like.

It will also be appreciated that one or more of the elements depicted in the drawings/figures can also be implemented in a more separated or integrated manner, or even removed or rendered as inoperable in certain cases, as is useful in accordance with a particular application.

It is also within the scope of an embodiment of the present invention to implement a program or code that can be stored in a machine-readable medium to permit a computer to perform any of the methods described above.

Additionally, the signal arrows in the drawings/Figures are considered as exemplary and are not limiting, unless otherwise specifically noted. Furthermore, the term "or" as used in this disclosure is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

It is also noted that the various functions, variables, or other parameters shown in the drawings and discussed in the text have been given particular names for purposes of identification. However, the function names, variable names, or other parameter names are only provided as some possible examples to identify the functions, variables, or other parameters. Other function names, variable names, or parameter names may be used to identify the functions, variables, or parameters shown in the drawings and discussed in the text.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for unified debug for simulation, the method comprising:
generating a transaction from a hardware verification language (HVL) testbench;
copying signal states in the HVL testbench after the transaction is generated, wherein a hardware description language (HDL) mirror copies the signal states in the HVL testbench by sampling of signal states of the transaction;
generating a response to the transaction from a device-under-test (DUT); and
displaying the signal states in the HVL testbench on a display screen as a first waveform, and displaying the DUT response on the display screen as a second waveform, in order to view a behavior of the HVL testbench.

2. The method of claim 1, further comprising:
using the displayed waveforms as information for debugging a simulation system.

3. The method of claim 1, further comprising:
sampling, by a monitor engine, the signal states in the HVL testbench.

4. The method of claim 1, wherein the signal states are stored in HVL objects in the HVL testbench.

5. The method of claim 1, wherein the act of copying the signal states comprises:
copying the signal states into objects in the HDL mirror.

6. The method of claim 5, wherein the signal states are copied during a predetermined sampling interval.

7. The method of claim 1, further comprising:
in response to the transaction, simulating, by an HDL simulator, the DUT.

8. The method of claim 7, further comprising:
in response to the act of simulating the DUT, generating, by the HDL simulator, a dumpfile.

9. An apparatus for unified debug for simulation, the apparatus comprising:
a hardware verification language (HVL) testbench configured to generate a transaction;
a hardware description language (HDL) mirror configured to copy signal states in the HVL testbench after the transaction is generated, wherein the HDL mirror copies the signal states in the HVL testbench by sampling of signal states of the transaction;
an HDL simulator configured to generate a simulation based upon the transaction;
a device-under-test (DUT) configured to generate a response to the transaction; and
a display screen configured to display the signal states in the HVL testbench as a first waveform, and display the DUT response as a second waveform, in order to display a behavior of the HVL testbench.

10. The apparatus of claim 9, wherein the displayed waveforms are used as information for debugging a simulation system.

11. The apparatus of claim 9, wherein the HDL mirror includes a monitor engine for sampling the signal states in the HVL testbench.

12. The apparatus of claim 9, wherein the signal states are stored in HVL objects in the HVL testbench.

13. The apparatus of claim 9, wherein the HDL mirror copies the signal states into objects in the HDL mirror.

14. The apparatus of claim 13, wherein the signal states are copied during a predetermined sampling interval.

15. The apparatus of claim 9, wherein the HDL simulator simulates the DUT to generate the DUT response.

16. The apparatus of claim 9, wherein the HDL simulator generates a dumpfile in response to simulation of the DUT.

17. An apparatus for unified debug for simulation, the apparatus comprising:
means for generating a transaction from a hardware verification language (HVL) testbench;
means for copying signal states in the HVL testbench after the transaction is generated, wherein the signal states are copied in a hardware description language (HDL) mirror by sampling of signal states of the transaction;
means for generating a response to the transaction from a device-under-test (DUT); and
means for displaying the signal states in the HVL testbench on a display screen as a first waveform, and displaying the DUT response on the display screen as a second waveform, in order to display a behavior of the HVL testbench.

18. An article of manufacture, comprising:
a machine-readable medium having stored thereon instructions to:
generate a transaction from a hardware verification language (HVL) testbench;
copy signal states in the HVL testbench after the transaction is generated, wherein a hardware description language (HDL) mirror copies the signal states in the HVL testbench by sampling of signal states of the transaction;
generate a response to the transaction from a device-under-test (DUT); and
display the signal states in the HVL testbench on a display screen as a first waveform, and displaying the DUT response on the display screen as a second waveform, in order to display a behavior of the HVL testbench.

* * * * *